United States Patent [19]
Noble, Jr.

[11] Patent Number: 5,422,294
[45] Date of Patent: Jun. 6, 1995

[54] METHOD OF MAKING A TRENCH CAPACITOR FIELD SHIELD WITH SIDEWALL CONTACT

[76] Inventor: Wendell P. Noble, Jr., 84 Swamp Rd., Milton, Vt. 05468

[21] Appl. No.: 56,090

[22] Filed: May 3, 1993

[51] Int. Cl.⁶ .......................................... H01L 21/8229
[52] U.S. Cl. .......................................... 437/52; 437/60; 437/203; 437/919
[58] Field of Search ...................... 437/47, 48, 52, 60, 437/203, 919; 257/340, 394, 630

[56] References Cited

U.S. PATENT DOCUMENTS

| | | | |
|---|---|---|---|
| 4,278,473 | 7/1981 | Borden | 437/203 |
| 4,791,463 | 12/1988 | Malhi | 357/23.6 |
| 4,801,988 | 1/1989 | Kenney | 357/23.6 |
| 4,873,560 | 10/1989 | Sunami et al. | 357/23.6 |
| 4,918,502 | 4/1990 | Kaga et al. | 357/23.6 |
| 5,026,659 | 6/1991 | Lee | 437/52 |
| 5,041,887 | 8/1991 | Kumagai et al. | 357/23.6 |
| 5,096,849 | 3/1992 | Beilstein, Jr. et al. | 437/67 |
| 5,100,823 | 3/1992 | Yamada | 437/203 |
| 5,164,917 | 11/1992 | Shichijo | 365/149 |

FOREIGN PATENT DOCUMENTS

| | | |
|---|---|---|
| 0164829 | 12/1985 | European Pat. Off. . |
| 38855 | 2/1985 | Japan . |
| 02-77155 | 3/1990 | Japan . |
| 2100291 | 12/1982 | United Kingdom . |

Primary Examiner—Tom Thomas
Attorney, Agent, or Firm—Lawrence H. Meier; James M. Leas

[57] ABSTRACT

Structures and methods are presented for forming a field shield for a trench capacitor for a memory cell with a contact through insulator along a sidewall of the trench to a desired region of the semiconducting substrate. The desired region is typically held at a substantially fixed potential; in any case it does not include a node diffusion.

27 Claims, 7 Drawing Sheets

METHOD OF MAKING A TRENCH CAPACITOR FIELD SHIELD WITH SIDEWALL CONTACT

FIELD OF THE INVENTION

This invention generally relates to field shields for DRAM trench storage capacitors. More particularly, it relates to a device and method for making electrical contact between a field shield and a selected layer of the substrate along a sidewall of the trench capacitor.

BACKGROUND OF THE INVENTION

Long retention of charge is important to the success of a DRAM cell design. Among the mechanisms known to be responsible for charge leakage, several are enhanced by the charge stored in the capacitor itself. For these mechanisms, discussed in more detail below, the capacitor gates its own leakage.

In connection with the following discussion of capacitor charge leakage in conventional trench memory cells, reference should be made to the prior art trench memory cell illustrated in FIG. 1. The cell includes CMOS transistor 7 located in n-well 19 formed in p− epitaxial silicon (epi) layer 13 grown on p+ silicon substrate 14. Transistor 7 has diffusion 8 connected through surface strap 9 to capacitor 10 formed in trench 11. Because of its direct connection to a capacitor electrode, in this case inner electrode 17 of capacitor 10, this transistor diffusion 8 is known as the node diffusion. Trench 11 is lined with a relatively thin dielectric layer 15 along a middle and bottom sidewall portion and a relatively thick dielectric layer 16 along a top sidewall portion. Inner electrode 17 of trench capacitor 10 is formed from p+ doped polycrystalline silicon (polysilicon) and fills the portions of trench 11 not occupied by dielectric layers 15 and 16. The outer electrode of capacitor 10 is formed from p+ substrate 14 surrounding trench 11. The potential of outer electrode 14 typically is held fixed while the potential of electrode 17 varies under the control of transistor 7. The varying electrode, in this case inner electrode 17, is also called the storage node.

One mechanism by which the capacitor gates its own leakage is identified as the gated diode mechanism. As will be discussed in more detail hereinafter, a gate disposed along the junction of a diode causes depletion of charge on one electrode of the diode when the gate is held at a high voltage and causes depletion of charge on the other electrode when the gate is held low. Charges generated within the depletion region on either side of the junction are swept across the junction and are a source of leakage current that limits the retention time of the cell. Generation of charge in the depletion region of a diode electrode depends on factors including the doping level and the presence of defects in the silicon of the depletion region.

There are at least two gated diodes along the periphery of the prior art trench capacitor illustrated in FIG. 1. The first gated diode is formed from node diffusion 8 and n-well 19. The junction of the diode exists at the interface of diffusion 8 and n-well 19 and adjoins dielectric layer 16. Both electrodes of the diode are effected by the variation of charge on capacitor electrode 17 which serves as the gate of the diode. As the charge on electrode 17 changes, either the lightly doped n-well 19 side or the heavily doped node diffusion 8 side of the diode is depleted. Electron-hole pairs generated within the depletion regions are swept across the junction by the diode built-in potential and discharge the capacitor by way of the node diffusion and surface strap.

Another problem caused by the gated diode mechanism is high chip standby current. Standby current is the current flowing through the chip when nothing else is happening. The result of higher standby current is faster draining of batteries that may be the power supply for the memory chips. Standby current is increased when the second of the above-mentioned gated diodes experiences gated diode leakage. This second gated diode is formed at the boundary between p− epi layer 13 and lightly doped n-well 19 and adjoins dielectric layer 16. Both electrodes 13 and 19 of the diode are effected by the variation of charge on electrode 17 which serves as the gate of the diode. As the charge on electrode 17 changes, either the p− layer 13 side or the n-well 19 side of the diode is depleted. Electron-hole pairs generated within the depletion regions are swept across the junction by the diode built-in potential and are collected by power supply contacts.

Another leakage mechanism gated by the capacitor is lateral punch-through between node diffusions of adjacent cells. Punch-through current between a node diffusion held at a high electrical potential, typically about 3.3 Volts, and an adjacent node diffusion held at a low electrical potential, typically about 0 Volts, is substantially increased because the node electrode gates the n-well. Since the n-well is typically held at a potential 1 volt above the power supply voltage (VDD), or about 4.6 Volts, the n-well adjacent each of the two trench capacitors is depleted by the gating of the node electrode of the capacitor. The area for punch-through current flow includes the area of these depletion regions as well as the area of the two node diffusions. If the depletion regions of the adjacent trenches overlap, punch-through currents flow, and charges are swept between the nodes, discharging one of the capacitors. The spacing between trench cells is expected ultimately to be limited by punch-through between capacitor gate induced depletion layers if means to reduce the capacitor gating is not implemented.

Another mechanism by which the capacitor gates its own leakage, also described with reference to FIG. 1, involves the gating of unwanted vertical and horizontal parasitic transistors by the charge stored on electrode 17. A vertical parasitic transistor can be formed between node diffusion 8 and p− epi layer 13. A horizontal parasitic capacitor can be formed between node diffusion 8 of one transistor and the node diffusion of a neighboring cell (not shown). A low voltage on the capacitor electrode depletes or inverts the doping on the lightly doped semiconductor between the two diffusions. Sub-threshold currents between the diffusions, along with the gated diode currents, may be sufficient to seriously degrade the retention time of memory cells.

The trench capacitor can also serve as an alternate gate between the diffusions of the transfer transistor in cell designs in which the gate of the transistor crosses over the trench capacitor. If, in this design, the voltage on the node electrode in the trench depletes the lightly doped region between the diffusions of the transistor, sub-threshold currents can decrease retention time. In addition, in this design a corner transistor in parallel with the bulk transfer device located at the intersection of the transistor and the trench capacitor is found to have a significantly lower threshold voltage than the bulk device, and therefore, substantially higher leakage.

Moreover, depletion along the trench sidewall due to charge on the capacitor diminishes well resistance, thereby decreasing the speed of the DRAM cell and increasing circuit noise and latch-up sensitivity.

Thus, it is desirable to reduce the field strength of the capacitor storage electrode gating the diodes and the n-well. Two methods have been proposed in the prior art for reducing this field strength: (1) thick dielectric collars and (2) conducting field shields. In commonly assigned U.S. Pat. No. 4,801,988, issued to Kenney, a structure and process is described for making a thick dielectric collar along an upper sidewall portion of a trench capacitor, for example, collar 16 illustrated in FIG. 1. A sufficiently thick dielectric collar is effective at lowering all the electric fields in the transfer device region, thereby (1) minimizing the width of depletion regions in adjacent layers and the magnitude of charge generated therein and (2) raising the threshold voltage for parasitic transistors. However, a thick collar has two problems: first, a thick collar provides an extended length within the trench not contributing to capacitance, and second, its girth conflicts with the need to construct ever more densely packed arrays.

Japanese Patent 2-77155 to Goto and Suzuki and U.S. Pat. No. 4,918,502 to Kaga et al. (the '502 patent), disclose trench memory cells having field shields electrically connected to the substrate at the trench bottom. These field shields are used in place of a thick dielectric collar, thereby avoiding the reduction of trench capacitance that occurs by using a thick dielectric collar. The field shield's substrate contact reduces one of the gated diode leakage problems, the one contributing to standby current, by eliminating the potential difference between the field shield and the substrate. However, it is believed that this structure intensifies the depletion of the n-well. For example, for a p- array cell design, the substrate is typically held at ground potential while the n-well is held at a potential 1 volt above the power supply voltage, which is typically 3.6 volts. Thus, the n-well will be depleted by the field shield gate, which is 4.6 volts lower than the n-well potential, and the structure will continue to generate leakage from the storage node because of vertical and horizontal parasitic transistors and gated diode currents from the node diode. The '502 patent illustrates contact between the field shield and a buried plate at the bottom of the trench for an n array cell design. Contact to a buried plate does not solve the above mentioned problem, since to avoid increasing standby current the n+ buried plate potential can be no lower than the p− substrate potential.

U.S. Pat. Nos. 5,041,887 to Kumagai et al. (the '887 patent), 5,164,917 to Shichijo (the '917 patent), 5,026,659 to Lee (the '659 patent), 4,873,560 to Sunami et al. (the '560 patent), and 4,791,463 to Malhi (the '463 patent), disclose trench memory cells having a buried connection between the storage node diffusion of the transfer transistor and the storage node plate of the capacitor.

The memory cell described in the '463 patent has a single layer of polysilicon in the trench that is used for the storage node plate; the fixed electrode is formed in the single crystal silicon and there is no field shield. The capacitors of the memory cells described in the '887, '917, and '659 patents have inner and outer electrodes formed in the trench. The outer electrode of each of these capacitors is the storage electrode and is attached through the sidewall to the storage node diffusion of the transfer transistor. The trench capacitors described in the '463, '887, '917, and '659 patents also have no field shield. As for the capacitor described in the '560 patent, the inner capacitor electrode is attached via the sidewall of the trench to a buried storage node diffusion and the outer fixed electrode serves as a field shield. Like the field shield of the '502 patent, the field shield disclosed in the '560 patent is connected to a buried plate at the bottom of the trench.

The prior art describes techniques for solving the standby current problem discussed above by connecting the field shield to the substrate at the bottom of the trench. The prior art has failed to note the need for a field shield that can be connected at an arbitrary depth in the trench to a selected layer in the silicon so as to turn off vertical and horizontal parasitic transistors and gated diodes. Field shields attached to the substrate contacts at the bottom of the trench may address standby current, but they do not solve charge retention time problems.

SUMMARY OF THE INVENTION

It is therefore an object of the present invention to provide a trench capacitor structure with a field shield designed to prevent gating of parasitic leakage currents.

It is another object of this invention to provide a method of constructing a trench capacitor having such a field shield.

It is another object of this invention to provide a method of forming a contact between a sheath layer and a selected layer of the substrate.

These and other objects of the invention are accomplished by the structure and method more fully described below for forming the storage capacitor of the present invention in a trench in a semiconductor substrate. The capacitor includes a layer of insulator lining the walls of the trench. A layer of electrically conductive material that forms the field shield is deposited on the insulator lining. The field shield is connected to a doped layer of the substrate at a selected position along the length of the sidewall of the trench by means of an electrically conductive member that extends through the layer of insulator. This contact to a doped layer is made at a position above the bottom of the trench and at a location other than where a transfer device node diffusion is located.

One example of a preferred contact scheme involves connecting the field shield to an n-well, which is located at the surface of the chip and extends a short distance below the transfer device diffusions. If the field shield is held at the same potential as the n-well, the lightly doped n-well will not be depleted and therefore the gate induced current in this level and the vertical and horizontal parasitic transistor currents will be eliminated. Thus, several key detractors from the retention time of the cell capacitor are eliminated. Since the n-well is located far above the bottom of the trench, the bottom contact scheme can not accomplish this goal.

BRIEF DESCRIPTION OF THE DRAWINGS

The foregoing and other objects, features, and advantages of the invention will be apparent from the following detailed description of the invention, as illustrated in the accompanying drawings, in which:

FIGS. 3a' to 3d' are cross-sectional views showing an alternate process for forming a field shield of the type formed using the process illustrated in FIGS. 3a-3h, with steps 3a'-3d' being used in place of steps 3a-3c;

DETAILED DESCRIPTION OF THE INVENTION

Figure 1:
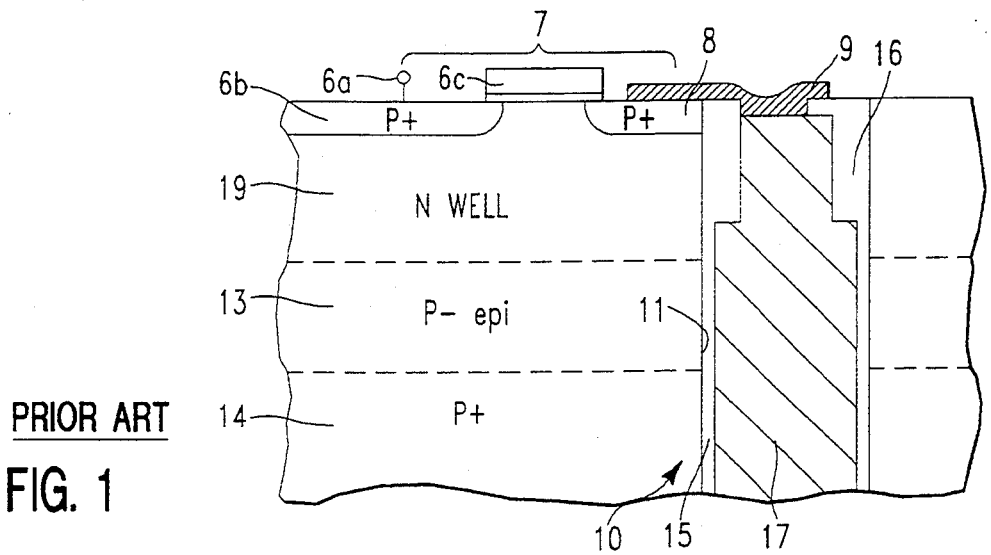
FIG. 1 is a cross-sectional view of a prior art memory cell.

The present invention is a field shield with a sidewall contact and processes for fabricating the field shield with such a sidewall contact. The field shield is designed to eliminate retention time degrading mechanisms and can be used to avoid gated diode mechanisms that contribute to standby current, as described in greater detail hereinafter. The contact is made at an appropriate position along the sidewall of the trench to a region of the substrate adjoining the trench. The region is preferably the well of the transfer transistor. Other possible contact regions include the buried plate of the capacitor or the substrate of the chip.

This invention encompasses three structural embodiments of the field shield for the trench capacitor: (1) a field shield along only top portions of the sidewalls of the trench, (2) a field shield along the full length of the sidewalls of the trench, and (3) a field shield along the full length of the sidewalls and along the bottom of the trench. The invention also encompasses three process embodiments, each with a different process sequence for forming the sidewall contacting member, the sidewall insulator, an opening in the sidewall insulator, and the field shield.

In the first embodiment, presented in FIGS. 2a-2g, the field shield is located only along top portions of the sidewalls of the trench, and the field shield contacts the n-well region of the substrate. In the process for forming this embodiment, the sidewall contacting member is formed first, then the insulator is deposited, and then the conductive field shield is deposited.

The semiconducting wafer used in the processes illustrated in FIGS. 2-4 is formed from materials such as silicon, germanium and gallium arsenide. The wafer includes n-well 19 formed in p− epi layer 13 grown on p+ substrate 14. As the first step in the process illustrated in FIGS. 2a-2g, pad layer 21 is deposited on the surface of the silicon as illustrated in FIG. 2a. Pad layer 21 is formed from one or more layers of material, including thermal or deposited silicon dioxide or silicon nitride. The use of a material like silicon nitride provides an excellent chemical-mechanical polish stop layer that will be needed at several subsequent steps, as discussed hereinafter. After patterning layer 21, using known techniques, so as to form an opening in pad 21 in areas where a trench is wanted, trench 11 is anisotropically etched a specified depth into substrate 14. The latter forms the outer electrode of the trench capacitor.

As the next step, capacitor dielectric insulator 15 is formed on the silicon surfaces of trench 11 by methods known in the art. Insulator 15 is preferably about 50 to 150Å including thermally grown silicon oxide, thermally grown or deposited silicon nitride, and composites thereof, or materials such as tantalum pentoxide. A composite film of silicon oxide upon which is deposited a silicon nitride is preferred for insulator 15 since the nitride will prevent sidewall oxidation during an oxidation step described hereinbelow. Although not illustrated, the deposition of insulator 15 in trench 11 results in the same deposition on top of pad 21.

Figure 2A:
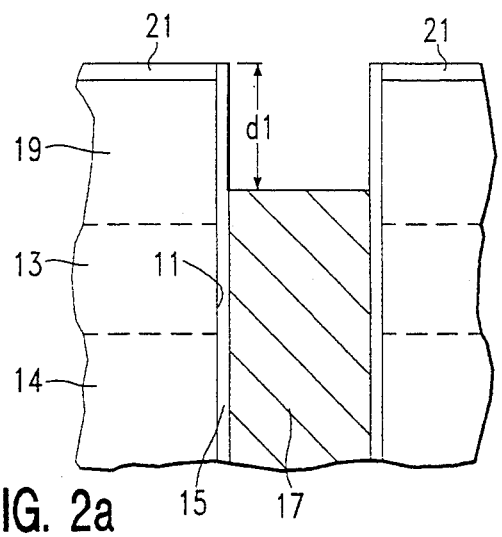
FIGS. 2a to 2g are cross-sectional views showing the process steps for making the top-trench field shield embodiment of the present invention.

Trench 11 is then filled with inner capacitor electrode 17 formed from a material such as polysilicon or amorphous silicon using a process known in the art, for example, chemical vapor deposition (CVD). The polysilicon is doped either during or after the deposition. The surface is then planarized using, for example a chemical-mechanical polishing process so electrode 17 is nearly level with pad layer 21. In this chemical-mechanical polishing, pad layer 21 acts as a polish stop. Electrode 17 is then recessed below the top surface of pad layer 21 to a depth "d1" by means of an anisotropic etch so that the top of the electrode is slightly below the location where sidewall contact is desired, as shown in FIG. 2a. Depth "d1" can be controlled to a high level of accuracy by methods known in the art.

Figure 2B:
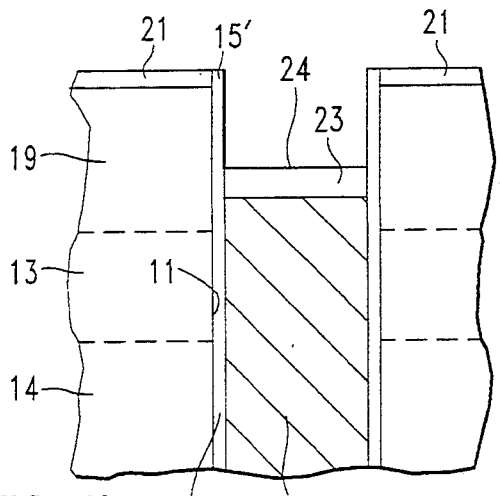
Figure 2C:
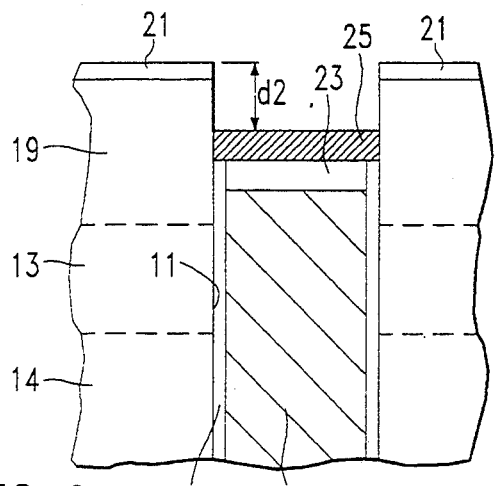

As illustrated in FIG. 2b, first etch stop layer 23 is deposited on the exposed horizontal surface of electrode 17. The first etch stop layer 23 is formed from materials such as silicon dioxide or silicon nitride, thermally grown on the polysilicon. Most preferably, the first etch stop layer has a thickness in the range of about 500Å to about 5000Å.

The next step in the process is the removal of upper portion 15' (FIG. 2b) of sidewall insulator 15. Portion 15' is unprotected by first etch stop layer 23 and may be removed by isotropic etchants such as dilute HF and hot phosphoric acid. First etch stop layer 23 must be thick enough so that it is not removed during the etch to remove thin sidewall insulator portion 15'. Top surface 24 (FIG. 2b) of first etch stop layer 23 defines the level at which the bottom-most portion of the sidewall contact will be located.

Next, the portion of trench 11 above etch stop layer 23 is filled with a conductor such as polysilicon. In practice, trench 11 is typically overfilled, and a layer of the conductor is also deposited on pad layer 21. The conductor is then planarized using a conventional chemical-mechanical polish so the conductor is substantially coplanar with the top surface of pad layer 21, with the latter functioning as an etch-stop. The conductor in trench 11 is then recessed by means of anisotropic etch to a depth "d2" (FIG. 2c) where the top of the sidewall contact is desired. Depth d2 can be controlled to a high level of accuracy by methods known in the art. A thin "plate" 25 of conductor that contacts the silicon sidewall of trench 11 remains after the anisotropic etch. When plate 25 is made of polysilicon it preferably has a thickness in the range of about 100Å to about 5000Å.

Figure 2D:
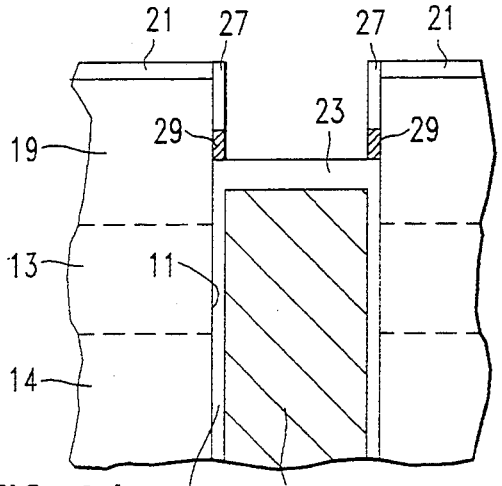

The next three steps in the process are (1) the formation of thin insulator 27 (a) on the sidewalls of trench 11 above plate 25 and (b) on plate 25; (2) the anisotropic etching of insulator 27 leaving insulator 27 along the sidewalls of trench 11 but removing insulator 27 on top of plate 25; and (3) the anisotropic etching of plate 25 leaving a ring 29 of conductor in contact with the surface of trench 11. The result of these steps is illustrated in FIG. 2d.

Thin insulator 27 is formed from materials such as silicon dioxide or silicon nitride, or composites thereof, which are thermally grown or CVD deposited, preferably to a thickness in the range of about 50Å to about 150Å. Most preferably, the thin insulator 27 comprises a composite film of silicon oxide upon which is deposited a silicon nitride, and then a top layer of the silicon nitride is oxidized.

Figure 2E:
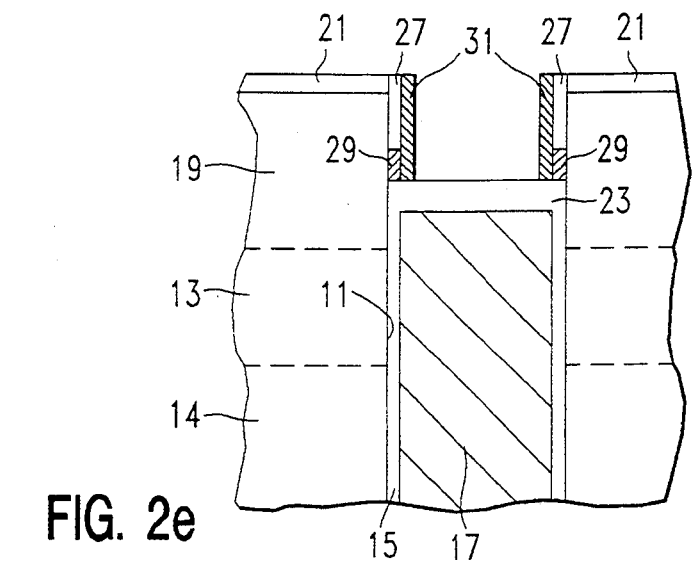

Next conductive field shield 31 is deposited to a thickness of about 50Å to about 500Å on the sidewalls of thin insulator 27 and in contact with ring 29 of conductor. Field shield 31 makes contact through thin insulator 27 with the silicon sidewall of trench 11 via conductive ring 29. Conductive field shield 31 is preferably formed from conductive materials such as polysilicon or amorphous silicon and is deposited by CVD or other known techniques. Then, field shield 31 is anisotropically etched to remove the polysilicon from horizontal surfaces while leaving it along the trench sidewall and in contact with ring 29 of conductor, as illustrated in FIG. 2e. After this etching step, field shield 31 remains isolated from the node polysilicon, that is electrode 17, by first etch stop layer 23. The result of these steps is illustrated in FIG. 2e.

Figure 2F:
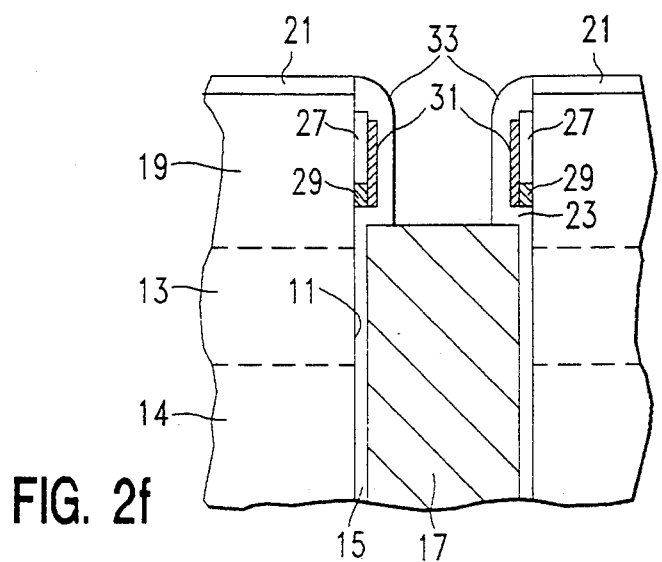

The two subsequent steps in the process are (1) the CVD deposition of insulating collar 33 and (2) the anisotropic etching of both insulating collar 33 and first etch stop layer 23 so as to leave insulation surrounding field shield 31 while opening up etch stop layer 23 to expose electrode 17 below. Anisotropic etching can be achieved by methods including reactive ion etching (RIE). The result of these steps is illustrated in FIG. 2f.

Insulating collar 33 is formed from materials such as CVD silicon dioxide or silicon nitride or composites thereof and should have a thickness in the range of about 100Å to about 1000Å. Most preferably collar 33 is formed from silicon dioxide.

Trench 11 is again filled with polysilicon, the transfer device 7 is formed by methods known in the art, and contact between storage electrode 17 and transfer device node diffusion 8 is made according to surface strap 9 or buried strap methods which are known in the art. The transfer device typically is a field effect transistor comprising a bit line contact 6a to a bit line diffusion 6b connected to the node diffusion by means of gate 6c. The resulting cell is illustrated in FIG. 2g.

Figure 2G:
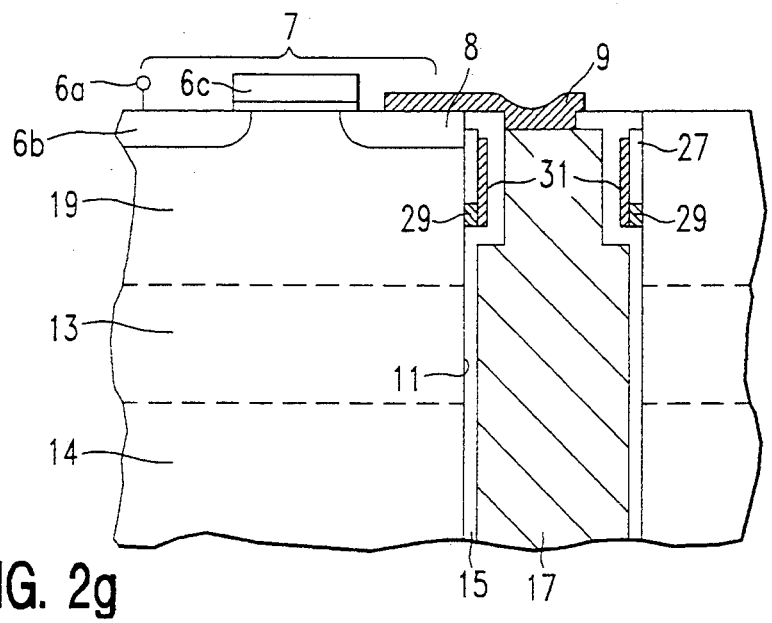

The illustration in FIG. 2g shows field shield 31 connected to and covering only a portion of n-well 19 within the substrate. Field shield 31 does not cross over junctions either at the top or bottom of n-well 19. This configuration reduces or eliminates gated diode problems encountered by the prior art either at the node diffusion or at the p+ substrate, while effectively eliminating vertical and horizontal parasitic transistor leakage.

In the second embodiment, presented in FIGS. 3a–3h, the field shield extends the full depth of trench 11, and if an additional process step discussed below is added, the field shield also extends along the bottom of the trench. The field shield is shown with contact to the n-well of the transfer device. In the process for forming this embodiment, the sidewall insulator is formed first, then an opening is formed in this insulator, and finally the sidewall contacting member and conductive field shield are deposited in a single step.

Figure 3A:
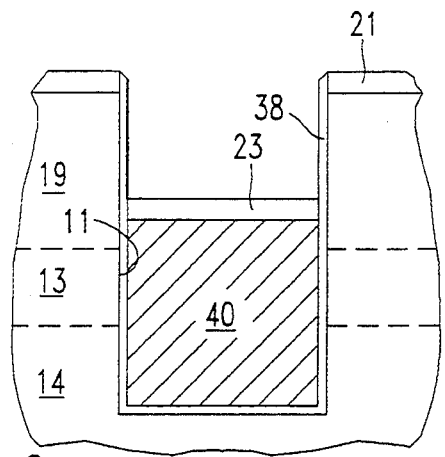
FIGS. 3a to 3h are cross-sectional views showing the process steps for making a full length field shield embodiment of the present invention.

As the first step in the fabrication of the second embodiment, the structure in FIG. 3a is formed using the steps for forming the structure illustrated in FIG. 2b as described above. The insulator lining trench 11 is identified by reference numeral 38 in FIG. 3a, rather than as insulator 15 (as used in FIGS. 2a–2g) to indicate that insulator 38 is the insulator for field shield 45 rather than the insulator for electrode 17, as described hereinafter. However, the composition, thickness, and fabrication method of insulator 38 are preferably as described above with respect to insulator 15. The material used to fill trench 11 is identified by reference numeral 40, rather than as electrode 17, to indicate that trench fill material 40 is an intermediate product that is later removed and, following subsequent process steps, replaced with electrode 17, as described hereinafter. Material 40 is preferably formed in the manner described above with respect to the formation of electrode 17 and may include materials such as polysilicon, as described hereinbelow. As also described hereinafter, the field shield contact of the second embodiment is placed at the level of first etch stop layer 23, whereas in the first embodiment the contact was placed immediately above layer 23.

Figure 3B:
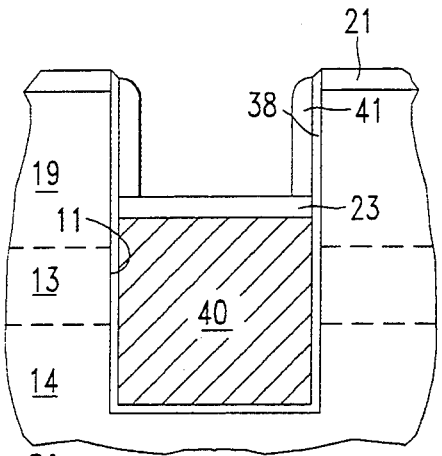

Once the process illustrated in FIG. 3a is complete, a second etch stop layer 41 is formed on insulator 38 of trench 11 above first etch stop layer 23, as illustrated in FIG. 3b. Second etch stop layer 41 is best formed by a CVD deposition of a material such as parylene followed by an anisotropic etch which removes material on horizontal surfaces but leaves most material on vertical surfaces. Parylene is particularly suitable for second etch stop layer 41 since it remains substantially in place during the next step, more fully described hereinbelow, while first etch stop layer 23 and exposed sidewall insulator 38 are isotropically etched. Parylene also has the advantage of being removable in a following step using a process that does not substantially degrade other exposed materials. The preparation and use of parylene is more fully described in commonly assigned U.S. Pat. No. 5,096,849 to Beilstein et al., which is incorporated by reference. Materials such as silicon nitride, silicon dioxide, alumina, and aluminum nitride can also be used. Most preferably, the thickness of second etch stop layer 41 is in the range of about 100Å to about 1000Å thick.

In the next three steps of the process (1) first etch stop layer 23 is removed by an isotropic etch; (2) the ring of sidewall insulator 38 thereby exposed is removed by isotropic etch steps so as to form an opening 43 in sidewall insulator 38 to a selected layer of substrate, such as n-well 19, where contact is desired; and (3) second etch stop layer 41 is removed by dissolution in a solvent or etch. The result of these steps is illustrated in FIG. 3c.

Figure 3C:
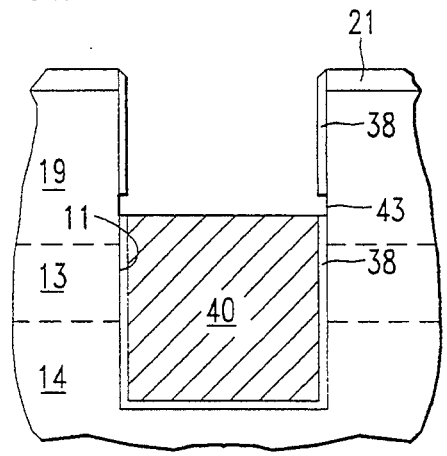

A structure similar to that of FIG. 3c can also be achieved by alternate process steps illustrated in FIGS. 3a' to 3d' in which first etch stop layer 23 is omitted as shown in FIG. 3a'. Second etch stop insulator 41 is conformally deposited directly on trench fill material 40 followed by an anisotropic etch step to expose the horizontal surface of trench fill 40 as shown in FIG. 3b'. Now trench fill 40 is subjected to an isotropic etch for a specified period of time. The isotropic etch involves sideways as well as downward etching, opening access to insulator 38 beginning at the bottom of second etch stop insulator 41 as illustrated in FIG. 3c'. This is followed by a second isotropic etch step, illustrated in FIG. 3d' to form opening 43 in sidewall insulator 38 to a selected layer of the substrate, such as n-well 19. In this process sequence, trench fill material 40 is not restricted to materials such as polysilicon since thermally grown insulator 23 is not needed on its surface. A variety of isotropically etchable materials are available for trench fill 40 of this alternative embodiment, including polysilicon, silicon oxide, silicon nitride, resist, photoresist, and parylene.

Figure 3D:
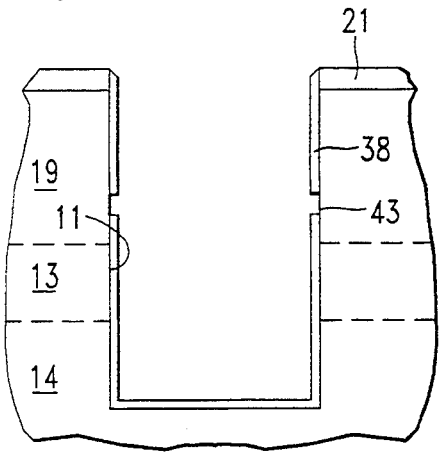

Referring again to the process steps illustrated in FIGS. 3a–3h, the next step is the removal of fill material 40 from the trench 11 by methods including either an isotropic or an anisotropic etch, as illustrated in FIG. 3d.

Once the trench fill has been removed a conductive layer 45, most preferably doped polysilicon, is conformally deposited. An anisotropic etch is then performed to recess conductive layer 45 below the surface of the single crystal semiconductor substrate. This etch also removes conductive layer 45 from the exposed horizontal surface along the bottom of the trench unless a process step as described hereinbelow is added. Conductive layer 45 thus forms a thin field shield on the insulator covered sidewalls of trench 11 that contacts n-well 19 outside trench 11 through opening 43 in sidewall insulator 38 formed by the above process steps. The result of these steps is illustrated in FIG. 3e.

Figure 3E:
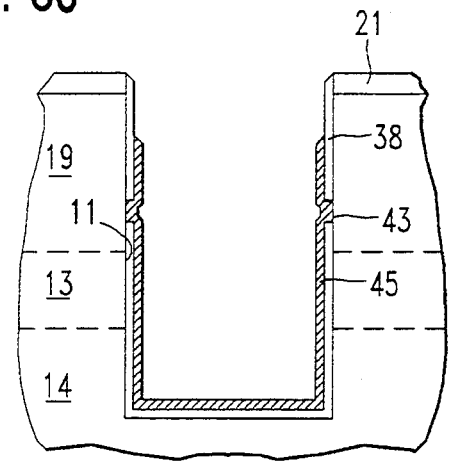

If a field shield at the bottom of the trench as well as along the sidewalls is desired, a trench filling step is added between the deposition and anisotropic etch of field shield 45 shown in FIG. 3e. In this alternate step, the trench is at least partially filled with a material such as resist or parylene which protects the field shield at the bottom of the trench during the anisotropic recess etch of the shield at the top. The field shield would then be present at the bottom of the trench through the rest of the process steps discussed below.

Figure 3F:
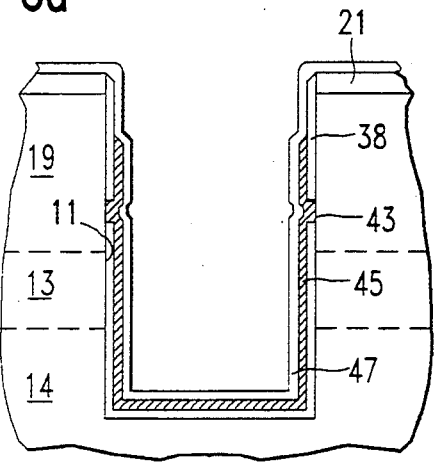

The next step is the formation of storage insulator 47 on field shield conductive layer 45 as illustrated in FIG. 3f. Insulator 47 is formed using the process steps used to form insulator 15 (FIG. 2a) as described hereinabove for the first embodiment.

Figures 3G, 3H:
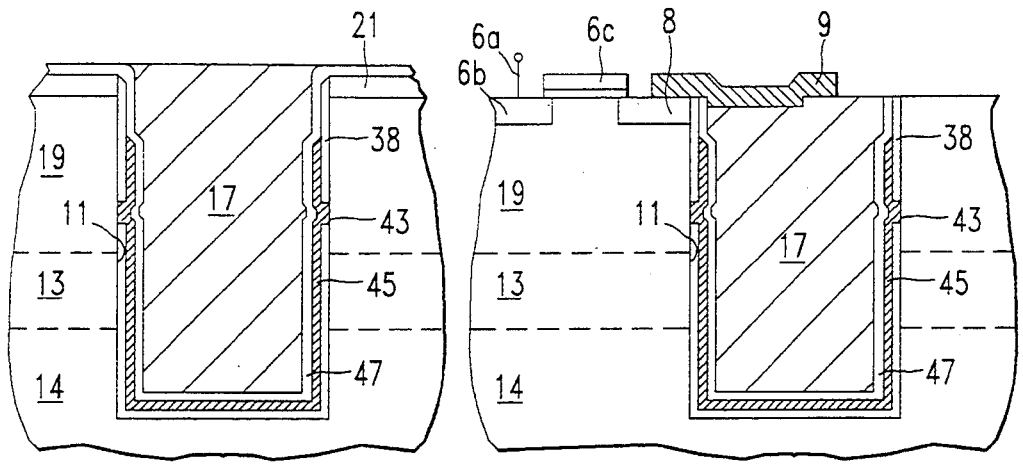
Figures 3A, 3B:
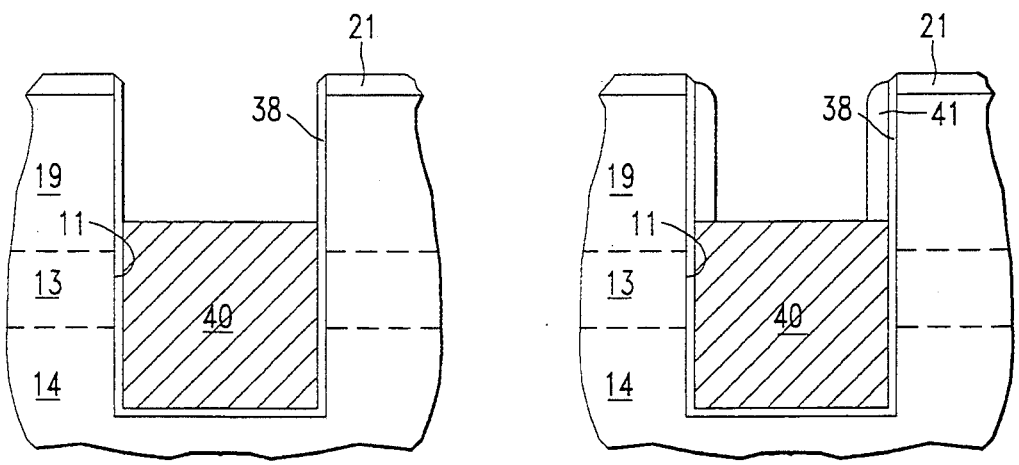
Figures 3C, 3D:
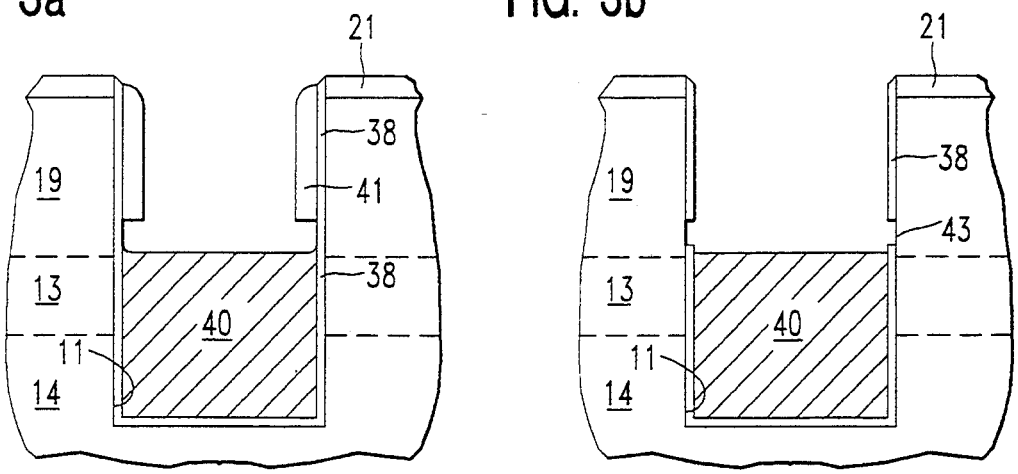

Finally, doped polysilicon is deposited filling portions of trench 11 not occupied by other layers to form storage electrode 17 of the capacitor, as illustrated in FIG. 3g. If the additional trench filling process step discussed above was included, FIG. 3g would show the field shield and its insulator on the bottom surface of the trench as well as along the sidewalls. Having the field shield along the bottom facilitates the use of the ½ VDD option, described in more detail hereinbelow, in which the fixed electrode of the capacitor, in this case field shield 45 itself, is held at ½ VDD. The storage electrode still varies from about zero volts (0 V) to about VDD. Since the electric field across the capacitor dielectric is half as great, a thinner dielectric can be used, providing an increase in storage capacitance. The transfer device 7 is then formed by methods known in the art, and contact between storage electrode 17 and transfer device node diffusion 8 is made according to surface strap 9 or buried strap methods which are known in the art. The transfer device typically is a field effect transistor comprising a bit line contact 6a to a bit line diffusion 6b connected to the node diffusion by means of gate 6c. The resulting cell is illustrated in FIG. 3h.

Figure 4A:
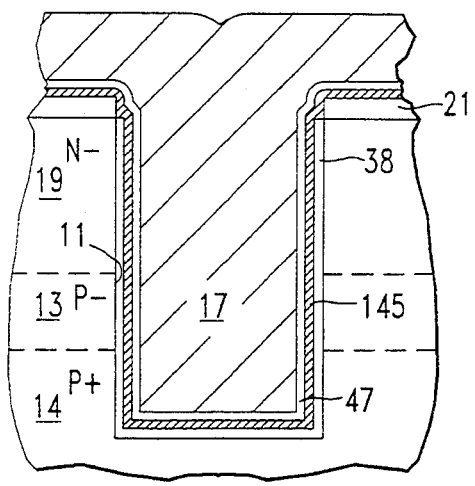
FIGS. 4a to 4p are cross-sectional views showing the process steps for making another full length and bottom field shield embodiment of the present invention.
Figure 4B:
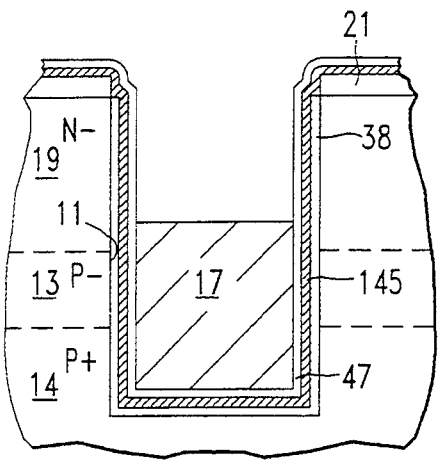
Figure 4C:
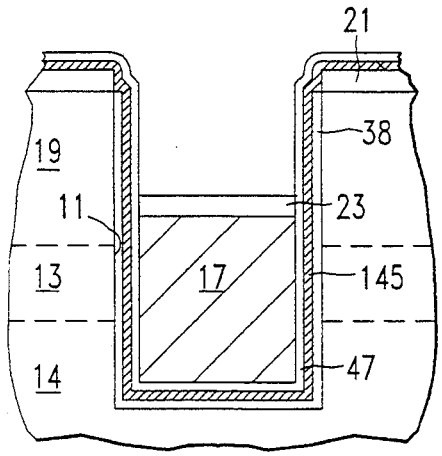
Figure 4D:
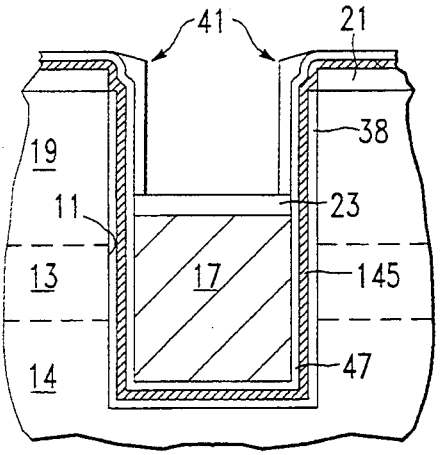
Figure 4E:
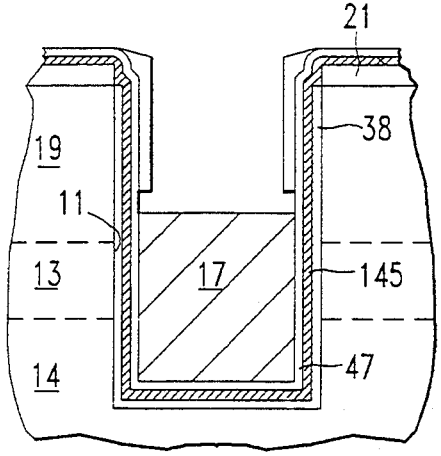
Figure 4F:
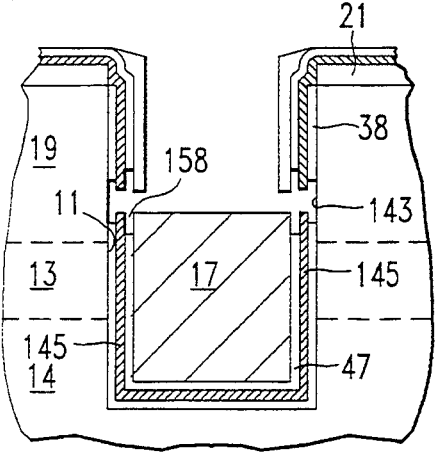
Figure 4G:
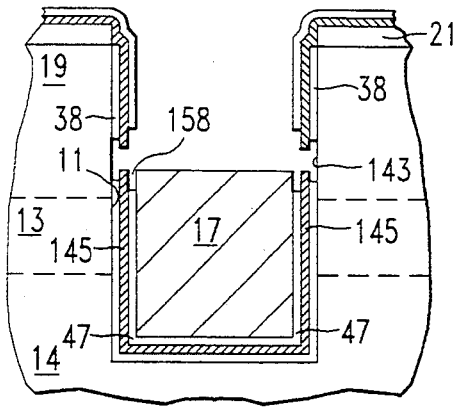
Figure 4H:
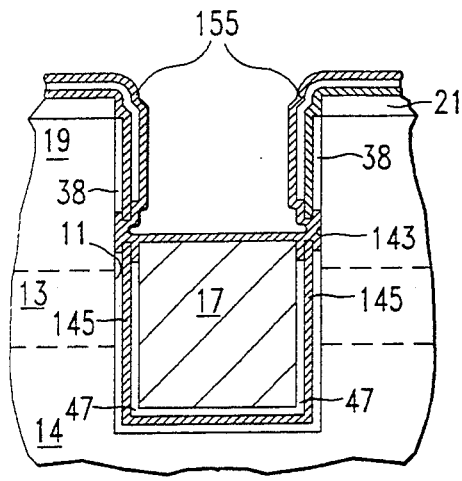
Figure 4I:
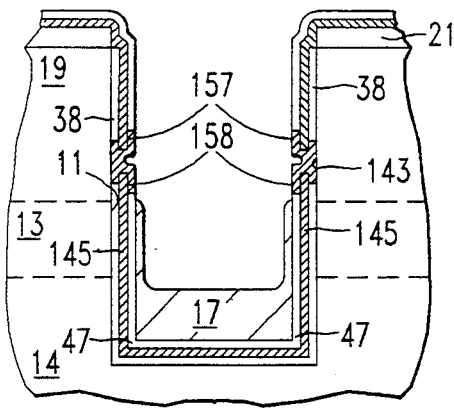
Figure 4J:
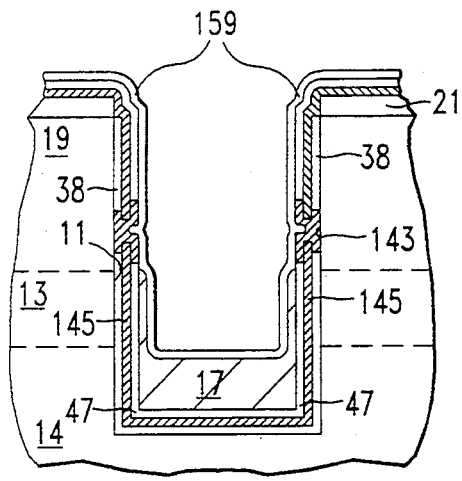
Figure 4K:
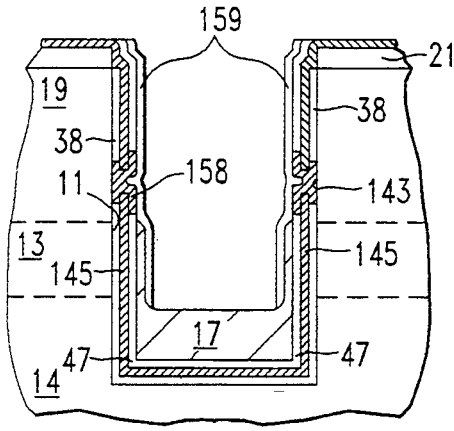
Figure 4L:
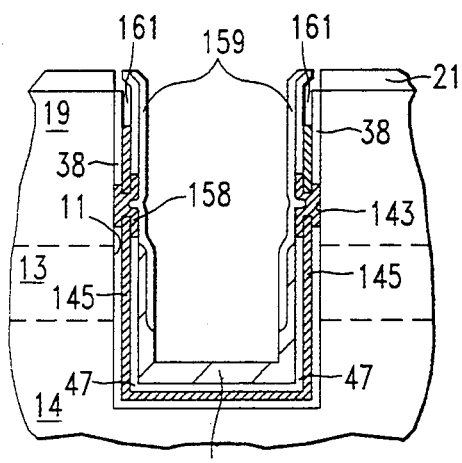
Figure 4M:
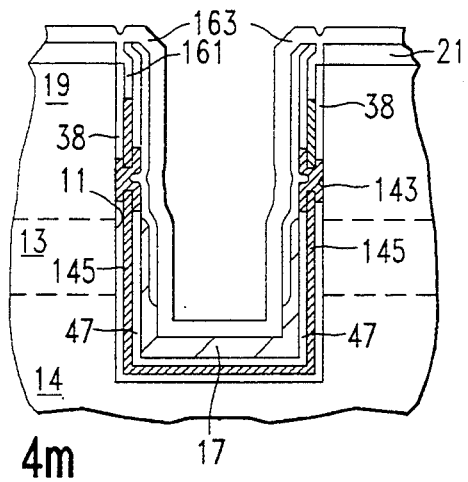
Figure 4N:
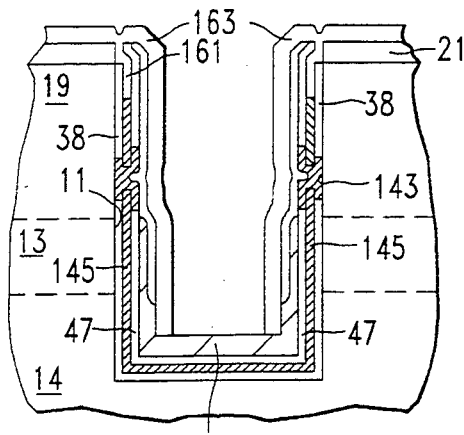
Figure 4O:
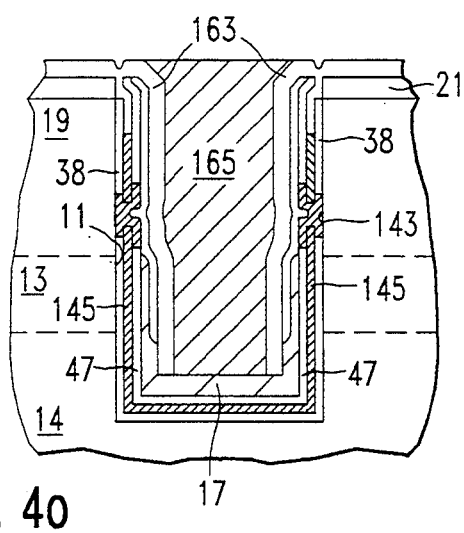
Figure 4P:
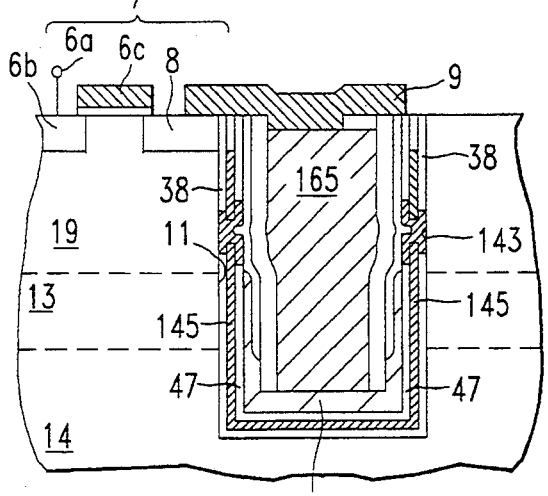

The third embodiment, presented in FIGS. 4a–4p, provides an alternate method of forming the field shield fully along the sidewalls and bottom of the trench. The field shield is again shown with contact to the n-well of the transfer device. In the process for forming this embodiment, the sidewall insulator is formed first, then the conductive field shield is deposited, then an opening is formed in these two layers, then the sidewall contacting member is deposited.

After the trench 11 and field shield insulator 38 are formed by methods described hereinabove for the second embodiment, a doped polysilicon field shield 145 is conformally deposited by CVD deposition on insulator 38 so as to line trench 11 as illustrated in FIG. 4a. The capacitor node dielectric 47 is then formed on the field shield 145 by the method described to form the node dielectric 15 for the first embodiment hereinabove, as illustrated in FIG. 2a. Inner node electrode 17 of the capacitor is then formed by CVD deposition of polysilicon. The layers of polysilicon can be doped either during deposition or by diffusion into previously deposited undoped polysilicon. These steps are illustrated in FIG. 4a. It will be clear from FIG. 4a and the discussion hereinbelow that in this embodiment both field shield 145 and electrode 17 are formed before forming the contact between field shield 38 and the desired layer of the substrate, in this case n-well 19.

As the next step, an anisotropic recess etch of the node electrode 17 is performed without a preliminary chemical-mechanical polish step. Field shield 145 remains covered and protected by the capacitor node dielectric 47 during this etch step. The etch brings node electrode 17 down to the approximate position of the desired sidewall contact as shown in FIG. 4b.

Next, first etch stop layer 23 is formed on the exposed horizontal polysilicon surface of electrode 17 as shown in FIG. 4c. First etch stop layer 23 is preferably formed from materials such as silicon dioxide or silicon nitride, which materials may be thermally grown on the horizontal surface of electrode 17. Most preferably, the first etch stop layer has a thickness in the range of about 100Å to about 5000Å.

Thereafter, a second etch stop layer 41 is formed on the portions of node dielectric 47 positioned above first etch stop layer 23. Second etch stop layer 41 is best formed by a CVD deposition followed by an anisotropic etch by methods well known in the art, as shown in FIG. 4d.

Second etch stop layer 41 is formed from materials, such as parylene, that (1) are etched at a much slower rate than the material used for first etch stop layer 23 and (2) can later be removed without substantially degrading other exposed materials. Most preferably, the second etch stop layer has a thickness in the range of about 100Å to about 1000Å.

The next step of the process is the removal of first etch stop layer 23 by an isotropic etch, as illustrated in FIG. 4e. This etch exposes node dielectric 47 at the level where contact between field shield 145 and substrate 14 is desired. Typical regions of substrate 14 where contact is made include an n-well, p-well, n+ buried plate, p+ buried plate, n+ substrate, or p+ substrate.

Then, a ring of node dielectric 47 is removed at the same level where first etch stop layer 23 was positioned. This ring of node dielectric 47 is removed when layer 23 is removed or in subsequent isotropic etch steps. A ring of field shield 145 is then removed at the same level where layer 23 was positioned by using an isotropic silicon etch step, thereby forming an opening in the field shield to an area of the field shield insulator 38. A ring of field shield insulator 38 is then removed, also at the level where layer 23 was positioned, by using an isotropic etch. By this removal of concentric rings of node dielectric 47, field shield 145, and insulator 38, a contact opening 143 is formed to an area of substrate 14, such as n-well 19. These steps are illustrated in FIG. 4f.

Except for possible undercutting, the insulator-poly-insulator behind second etch stop layer 41 was protected by second etch stop layer 41 during the isotropic etches that formed contact opening 143 to the sidewall of trench 11. Once contact to the single crystal at the desired location has been achieved, second etch stop layer 41 is removed by dissolution or etch, as illustrated in FIG. 4g.

Conformal conductive layer 155, formed most preferably from doped polysilicon, is then deposited filling ring opening 143 formed through insulator 47, field shield 145, and insulator 38, thereby forming a contact between field shield 145 and n-well 19. A portion of conductive layer 155 also contacts the exposed top portion of node electrode 17.

An anisotropic etch is then used to remove conductive layer 155 from an upper sidewall portion of node dielectric 47 above opening 143, now filled with a portion of conductive layer 155. During the time required to remove conductive layer 155 from upper sidewall portion of node dielectric 47, conductive layer 155 is removed from the horizontal top surface of electrode 17 and electrode 17 is substantially recessed. The etch leaves a ring 157 of conductive layer 155 in opening 143. The configuration at the end of the recess etch is shown in FIG. 4i.

In the course of the isotropic etches used to form opening 143 in insulator 38, node dielectric 47 above and below opening 143 was undercut leaving a void 158 between field shield 145 and node electrode 17, as illustrated in FIGS. 4f–4g. The deposition of conductive layer 155 fills void 158 with conductive material but the above-described recess etch of conductive layer 155 and electrode 17 avoids the potential short between field shield 145 and node electrode 17 because electrode 17 is thereby recessed below void 158, as illustrated in FIG. 4i.

After the recess etch, a new capacitor dielectric 159 is grown using materials and process as described in previous steps and illustrated in FIG. 4j. Dielectric 159 is then subjected to an anisotropic etch or etches to remove it from the exposed horizontal surface of node electrode 17 and from the top surface of the chip above field shield layer 145. The new capacitor dielectric 159 remains along vertical surfaces, on the polysilicon contact ring 157, and on portions of conductive layer 155 that may have filled void 158 in undercut node dielectric 47, as illustrated in FIG. 4k.

In the next step, illustrated in FIG. 4l, the top portion of field shield 145 is anisotropically etched to recess it below the height of pad dielectric 21, thereby leaving an empty region 161 between field shield insulator 38 and node insulator 47. This step also further etches the node electrode 17.

In the next step, insulator 163, typically silicon dioxide, is conformally CVD deposited to fill the empty region 161 left above the recessed field shield 145, as illustrated in FIG. 4m. The narrow opening of the empty region 161 is filled more quickly than the wider opening of the trench. Insulator 163 is then anisotropically etched leaving insulator 163 in the previously empty region 161 and along exposed vertical surfaces but opening up a horizontal surface of node electrode 17, as illustrated in FIG. 4n.

In the next step, illustrated in FIG. 4o, the remaining opening in trench 11 is filled with conductive material 165 so that conductive material 165 makes electrical contact with the horizontal surface of node electrode 17 that was exposed by the removal of the horizontal portion of insulator 163. Preferably, conductive material 165 is polysilicon deposited by CVD. Finally, conductive material 165 is planarized as necessary for subsequent processing.

The transfer device 7 is then formed by methods known in the art, and contact between storage electrode 17 and transfer device node diffusion 8 is made according to surface strap 9 or buried strap methods which are known in the art. The transfer device typically is a field effect transistor comprising a bit line contact 6a to a bit line diffusion 6b connected to the node diffusion by means of gate 6c. The resulting cell is illustrated in FIG. 4p.

Figure 5:
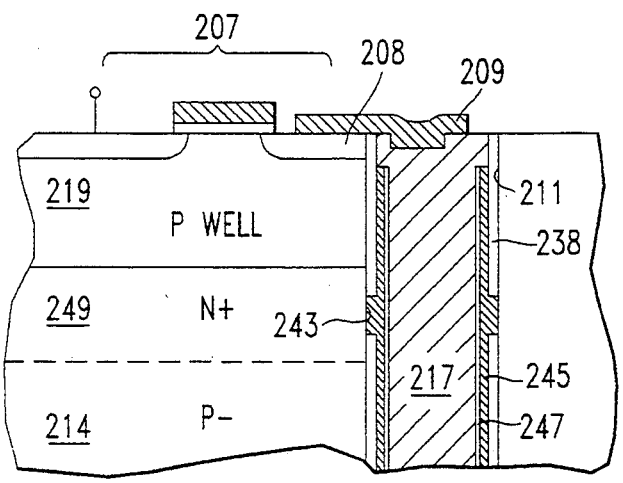
FIG. 5 is a cross-sectional view of a trench memory cell in which the field shield electrode is connected to an n+ well.

Providing a field shield extending along the bottom of trench 11 permits the use of the ½ VDD option in which the fixed electrode of the capacitor is held at ½ VDD. The ½ VDD option is more fully described by reference to FIG. 5 which illustrates a cell with an n-channel CMOS transistor 207 located in a p-well 219 formed in a p− silicon substrate 214. The transistor 207 has a diffusion 208 connected through surface strap 209 to capacitor 210 formed in trench 211. The trench 211 is lined with a relatively thin field shield dielectric layer 238, upon which is formed field shield 245 which serves as the capacitor outer electrode, on which is formed node dielectric 247. The structure is formed by methods such as those described in the discussion of FIGS. 3 and 4 hereinabove.

Inner electrode 217 is formed from n+ doped polysilicon filling trench 211 within node dielectric 247, while the outer electrode of the capacitor, i.e., field shield 245, contacts buried plate 249 surrounding trench 211 through opening 243 in field shield insulator 238. The potential of inner electrode 217 varies under the control of transistor 207 while the potential of outer electrode (field shield 245) typically is held fixed at the potential of buried plate 249. For the ½ VDD option, buried plate 249 is held at a potential equal to ½ VDD. As described hereinabove, this reduces the electrical stress on the node dielectric by a factor of two, permitting a thinner dielectric and greater capacitance.

While several embodiments of the invention, together with modifications thereof, have been described in detail herein and illustrated in the accompanying drawings, it will be evident that various further modifications are possible without departing from the scope of the invention. For example, FIGS. 2–4 illustrate PMOS cells with p+ diffusions and an n-well, but modifications to layers and voltages can be made that are known in the art to apply the invention to NMOS cells with n+ diffusions and a p-well such as that illustrated in FIG. 5. Similarly the ½ VDD option illustrated in FIG. 5 using an NMOS cell can be implemented with the PMOS structures of FIGS. 2–4. Nothing in the above specification is intended to limit the invention more narrowly than the appended claims. The examples given are intended only to be illustrative rather than exclusive.

What is claimed is:

1. A method of forming a contact between a capacitor field shield structure and a portion of a trench sidewall in a semiconductor substrate comprising the steps of:

exposing a portion of a sidewall of the trench;
   forming a conductive member in contact with said portion;
   forming a permanent insulating layer on remaining exposed regions of said portion; and forming a layer of field shield conductive material on said permanent insulating layer and contacting said conductive member.

2. A method as recited in claim 1, wherein said conductive member is formed by a method comprising the steps of:
   a) forming a second insulating layer along the sidewalls of the trench;
   b) depositing a selectively etchable second conductive material in the trench within said second insulating layer;
   c) etching said second conductive material to form a surface of said second conductive material below the level where the conductive member is to be positioned;
   d) forming an etch stop layer horizontally disposed on said second conductive material with an upper surface of said etch stop layer approximately at the level where said conductive member is to be positioned; and
   e) forming a third layer of conductive material on the etch stop layer and in contact with the sidewalls of the trench, to form said conductive member.

3. A method as recited in claim 2, wherein said conductive member is further processed after said first insulating layer is formed by a method comprising the additional step of anisotropic etching said third layer of conductive material to leave a thin ring of conductive material on the walls of the trench below said first insulating layer.

4. A method as recited in claim 3, wherein after said first layer of conductive material is formed, an opening is formed to said second conductive material by a method comprising the additional step of anisotropically etching selected portions of said etch stop layer.

5. A method as recited in claim 2, wherein said etch stop layer and said first and second insulating layers comprise at least one from the group: silicon dioxide and silicon nitride.

6. A method as recited in claim 1, wherein said conductive materials comprise doped polysilicon.

7. A method of forming a capacitor field shield structure in a trench in a semiconductor substrate adjacent a specified region of the substrate, the method comprising the steps of:
   forming an insulating layer along at least a portion of the substrate defining the sidewalls of the trench;
   removing a ring of said insulating layer along the sidewalls adjacent a portion of the specified region, so as to form an annular opening in said insulating layer to the sidewalls, which portion does not include a node diffusion; and
   forming a layer of electrically conductive material disposed on said insulating layer and extending through said opening to contact the sidewalls.

8. A method as recited in claim 7, wherein said ring is removed by a method comprising the steps of:
   a) filling the trench with a selectively removable first material and removing an upper section of said first material so that a top surface of said first material is at a depth where contact to the sidewalls is desired;
   b) forming a layer of a selectively removable second material horizontally disposed on said top surface of said first material;
   c) forming a selectively removable conformal masking layer on said insulating layer along the sidewall; and
   d) isotropically etching away said second material and any layer covering the sidewalls of the trench between said conformal masking layer and said first material, thereby forming said annular opening through said insulating layer, exposing the sidewalls.

9. A method as recited in claim 8, comprising the additional step of:
   e) removing said conformal masking layer.

10. A method as recited in claim 9, comprising the additional step of:
    f) removing said first material.

11. A method as recited in claim 8 wherein step (b) is eliminated and step (d) is replaced with:
    d') isotropically etching away said first material so as to expose a portion of said insulating layer, and then further isotropically etching away said insulating layer between said conformal masking layer and said first material, thereby forming said annular opening in the insulating layer.

12. A method as recited in claim 7 wherein said insulating layer is at least one from the group: silicon dioxide, silicon nitride, and tantalum pentoxide.

13. A method as recited in claim 8 wherein said first material is one from the group: polysilicon, amorphous silicon, resists, and photoresists.

14. A method as recited in claim 8 wherein said second material is one from the group: silicon dioxide and silicon nitride.

15. A method as recited in claim 8 wherein said conformal masking layer is one from the group: silicon dioxide, silicon nitride, alumina, parylene, and aluminum nitride.

16. A method as recited in claim 7 wherein said conductive material is polysilicon.

17. A method of forming a capacitor field shield structure in a trench in a semiconductor substrate adjacent a specified region of the substrate, the method comprising the steps of:
    forming an outer insulating layer along a portion of the substrate defining the sidewalls of the trench;
    forming a conductive layer disposed on said outer insulating layer;
    removing concentric rings of said conductive layer and said insulating layer so as to form an annular opening to the specified region of the substrate; and
    forming an electrically conductive member connected to said layer of electrically conductive material, and extending through said annular opening to the specified region of the substrate.

18. A method as recited in claim 17, comprising the steps, after said conductive layer is formed and before a ring of said conductive layer is removed, of
    forming an inner insulating layer disposed on said conductive layer;
    removing a ring of said inner insulating layer adjacent the specified region of the substrate.

19. A method as recited in claim 18, wherein said rings are removed by a method comprising the steps of:
    a) filling the trench within said inner insulating layer with a selectively removable first material and removing an upper section of said first material so that a top surface of the first material is at a depth about where contact to the sidewalls is desired;
    b) forming a layer of a second material horizontally disposed on said top surface of said first material;
    c) forming a conformal masking layer disposed on portions of said inner insulating layer; and d) isotropically etching away said second material and all layers covering the substrate that are located between the conformal masking layer and said first material, forming said annular opening through said insulating layers and said conductive layer, exposing the sidewalls.

20. A method as recited in claim 19, comprising the additional step of:

e) removing said conformal masking layer.

21. A method as recited in claim 17 wherein said outer and inner insulating layers include at least one from the group: silicon dioxide, silicon nitride, and tantalum pentoxide.

22. A method as recited in claim 17 wherein said first material includes one from the group: polysilicon and amorphous silicon.

23. A method as recited in claim 17 wherein said second material includes one from the group: silicon dioxide and silicon nitride, resist, and photoresist.

24. A method as recited in claim 17 wherein said conformal masking layer includes one from the group: alumina, parylene, and aluminum nitride.

25. A method as recited in claim 17 wherein the conductive layer and the conductive material are formed from polysilicon.

26. A method of forming a capacitor field shield structure having a sidewall connector in a trench in a semiconductor substrate, the method comprising the steps of:

a) providing a semiconductor substrate, said substrate having a semiconductor surface;

b) forming a trench in the substrate, said trench having a sidewall;

c) forming a heavily doped region adjacent said sidewall, said region having a portion extending to said semiconductor surface, said region being a circuit node having a varying potential during normal operation of the structure;

d) forming an insulator on said sidewall; and e) forming a conductive field shield layer within said trench at least in part spaced from said sidewall by said insulator, said layer having an outer and an inner surface, said layer making electrical contact with a portion of said sidewall, said layer not making electrical contact with said region.

27. A method as recited in claim 26 further comprising the step of connecting said portion to a circuit node having a fixed potential during normal operation of the structure.

* * * * *